(12) United States Patent
Kasai et al.

(10) Patent No.: US 11,828,794 B2
(45) Date of Patent: Nov. 28, 2023

(54) PLACEMENT TABLE, TESTING DEVICE, AND TESTING METHOD

(71) Applicant: TOKYO ELECTRON LIMITED, Tokyo (JP)

(72) Inventors: Shigeru Kasai, Yamanashi (JP); Tomohiro Ota, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 216 days.

(21) Appl. No.: 17/508,232

(22) Filed: Oct. 22, 2021

(65) Prior Publication Data

US 2022/0128624 A1 Apr. 28, 2022

(30) Foreign Application Priority Data

Oct. 28, 2020 (JP) ................................ 2020-180451

(51) Int. Cl.

| | |
|---|---|
| *G01R 31/28* | (2006.01) |
| *G01K 13/00* | (2021.01) |
| *G01K 7/01* | (2006.01) |
| *G01K 7/18* | (2006.01) |

(52) U.S. Cl.
CPC ........... *G01R 31/2875* (2013.01); *G01K 7/01* (2013.01); *G01K 7/18* (2013.01); *G01K 13/00* (2013.01)

(58) Field of Classification Search
CPC ............ G01R 31/2875; G01R 31/2865; G01R 31/2877; G01R 31/2891; G01K 7/01; G01K 7/18; G01K 13/00; H01L 21/67248; H01L 21/67103; H01L 21/67259; H01L 21/6838
See application file for complete search history.

(56) References Cited

U.S. PATENT DOCUMENTS

| | | | |
|---|---|---|---|
| 6,222,161 B1 * | 4/2001 | Shirakawa | ........ H01L 21/67248 219/390 |
| 2002/0017916 A1 | 2/2002 | Costello et al. | |
| 2005/0007136 A1 | 1/2005 | Feder et al. | |
| 2006/0132154 A1 | 6/2006 | Uher et al. | |
| 2008/0136436 A1 * | 6/2008 | Hong | ................. G01R 31/2865 324/754.03 |
| 2020/0075365 A1 * | 3/2020 | Aida | ................. H01L 21/67259 |
| 2021/0156890 A1 * | 5/2021 | Kobayashi | ........... G01R 1/0408 |

FOREIGN PATENT DOCUMENTS

JP 2011-002390 A 1/2011

\* cited by examiner

*Primary Examiner* — Giovanni Astacio-Oquendo
*Assistant Examiner* — Zannatul Ferdous
(74) *Attorney, Agent, or Firm* — Fenwick & West LLP

(57) ABSTRACT

There is provided a placement table having an upper surface on which a device to be processed is placed. The placement table comprises: a top plate having a placement surface for the device; a heating unit configured to heat the top plate; a plurality of temperature sensors configured to acquire temperature of the top plate at desired measurement positions in a plan view; and a positioning unit electrically connected to the temperature sensors and configured to position the temperature sensors at the measurement positions in a plan view. The positioning unit is formed of a flexible substrate having flexibility.

12 Claims, 7 Drawing Sheets

PLACEMENT TABLE, TESTING DEVICE, AND TESTING METHOD

CROSS-REFERENCE TO RELATED APPLICATIONS

This application claims priority to Japanese Patent Application No. 2020-180451, filed on Oct. 28, 2020, the entire contents of which are incorporated herein by reference.

TECHNICAL FIELD

The present disclosure relates to a placement table, a testing device, and a testing method.

BACKGROUND

Japanese Patent Application Publication No. 2011-0002390 discloses a temperature sensor that measures a processing temperature of a wafer held on a wafer chuck by a temperature detector inserted into an insertion hole formed in a side surface of the wafer chuck. In the temperature sensor described in Japanese Patent Application Publication No. 2011-0002390, a fixing block having a through hole corresponding to the insertion hole of the wafer chuck is connected to the side surface of the wafer chuck, and the temperature sensor is attached to the fixing block through an attachment member provided in a base portion of the temperature detector inserted into the insertion hole from the through hole.

SUMMARY

The present disclosure is directed to providing a technology for reducing a difference between an actual temperature of a device to be tested and a measured temperature of the device, which is measured by a temperature sensor, without reducing the structural strength of a placement table in a testing device.

In accordance with an aspect of the present disclosure, there is provided a placement table having an upper surface on which a device to be processed is placed. The placement table comprises: a top plate having a placement surface for the device; a heating unit configured to heat the top plate; a plurality of temperature sensors configured to acquire temperature of the top plate at desired measurement positions in a plan view; and a positioning unit electrically connected to the temperature sensors and configured to position the temperature sensors at the measurement positions in a plan view. The positioning unit is formed of a flexible substrate having flexibility.

DETAILED DESCRIPTION

Figure 1:
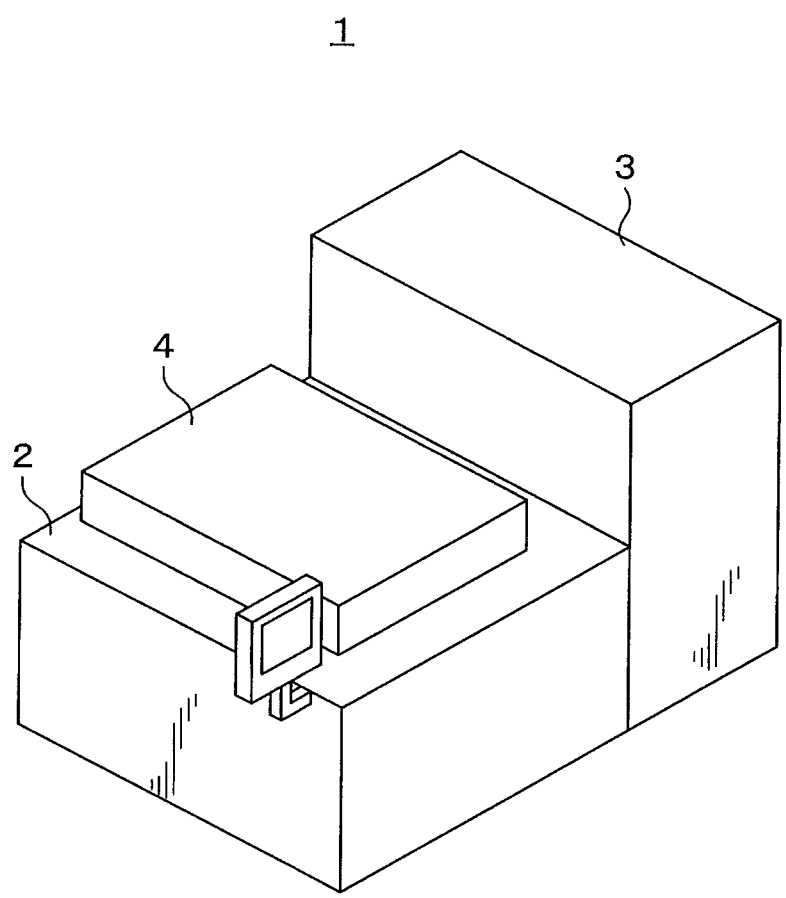
FIG. 1 is a schematic perspective view illustrating a configuration of a prober which is a testing device according to the present embodiment.

In a manufacturing process of a semiconductor device, a large number of semiconductor devices are simultaneously formed on a substrate such as a wafer. The formed semiconductor devices are tested for electrical characteristics or the like and are classified into non-defective devices and defective devices. The testing is performed using a testing device, for example, in the state of the substrate before being divided into each semiconductor device.

A testing device referred to as a prober or the like includes a placement table, on which the substrate on which the semiconductor device is formed is placed, and a probe card having a large number of probes is attached to the testing device. During the testing, in the testing device, an electrical signal is supplied from a tester to the semiconductor device via the probe in a state where the semiconductor device and the probe are in contact with each other. Then, based on the electrical signal received by the tester from the semiconductor device via the probe, it is determined whether the semiconductor device is a defective device.

In this type of testing device, when testing electrical characteristics of the semiconductor device, in order to simulate a mounting environment of the semiconductor device, a temperature of the semiconductor device formed on the substrate may be adjusted by adjusting a temperature of the placement table by a heating mechanism or a cooling mechanism provided in the placement table.

By the way, in order to appropriately test the electrical characteristics of the semiconductor device in the testing device, it is necessary to appropriately ascertain the temperature of each semiconductor device formed on the substrate. Therefore, in the conventional testing device, by forming the placement table, on which the substrate is placed, using a material (for example, Cu or Al) having high heat conductivity, heat conduction in a surface direction is enhanced and heat uniformity is improved.

However, due to the influence of an increase in amount of heat generated according to a recent increase in integration of semiconductor devices, a difference in thermal resistance due to a difference in distance in the surface direction from the semiconductor device to be tested to the temperature sensor provided on the placement table may not be negligible. That is, due to the influence of the increase in amount of heat generated by the semiconductor device, even a small difference in thermal resistance due to separation between the semiconductor device and the temperature sensor causes a large temperature difference, which may cause a difference between an actual temperature of the semiconductor device and a measured temperature by the temperature sensor.

Moreover, the influence due to the difference in distance to the temperature sensor is considered to be particularly large in the structure of the placement table (wafer chuck) as disclosed in Japanese Patent Application Publication No. 2011-0002390, specifically, in the structure of the placement table in which only one temperature sensor is provided in a surface.

As a method of reducing the difference between the actual temperature of the semiconductor device and the measured temperature by the temperature sensor, for example, it is conceivable to provide a plurality of temperature sensors in the surface of the placement table. In this way, by providing a plurality of temperature sensors in the surface of the placement table and selecting the temperature sensor closest to the semiconductor device to be tested to perform testing, a distance between the semiconductor device and the temperature sensor in a surface direction can be reduced, and thus, the difference between the actual temperature and the measured temperature can be reduced.

However, when the plurality of temperature sensors are provided in the surface of the placement table in this way, it is difficult to apply, as the temperature sensor, a temperature sensor with a sheath such as an RTD sensor (for example, a platinum resistance sensor) conventionally used in the testing device. Specifically, when the temperature sensor is provided inside the placement table, it is necessary to form an insertion hole into which the temperature sensor is inserted in the placement table. In this case, when using the conventional temperature sensor with a sheath, it is necessary to form as many insertion holes as the number of temperature sensors to be installed in the placement table, which may reduce the structural strength of the placement table and cause warpage.

Therefore, by a technology according to the present disclosure, it is possible to reduce a difference between an actual temperature of a device to be tested and a measured temperature of the device measured by a temperature sensor, without reducing the structural strength of a placement table in a testing device.

Hereinafter, a placement table, a testing device provided with the placement table, and a testing method to be performed using the testing device according to the present embodiment will be described with reference to the accompanying drawings. In the present specification and the drawings, elements having substantially the same functional configuration are designated by the same reference numerals, and thus, overlapping descriptions will be omitted.

Figure 2:
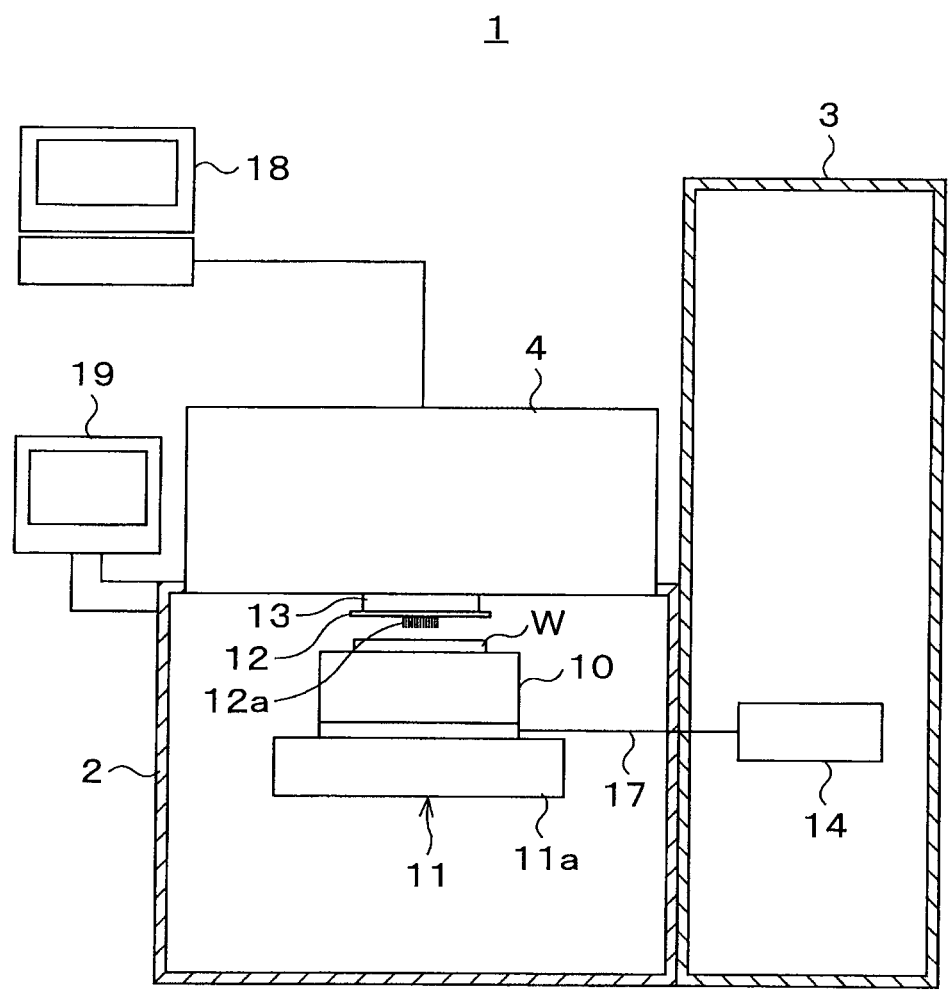
FIG. 2 is a schematic front view illustrating the configuration of the prober which is the testing device according to the present embodiment.

FIGS. 1 and 2 are a schematic perspective view and a schematic front view illustrating the configuration of a prober 1 which is a testing device and has a stage as a placement table according to the present embodiment. In FIG. 2, a portion of the prober 1 is shown in a cross section in order to show components contained in an accommodation chamber and a loader, which will be described below, of the prober 1 in FIG. 1.

The prober 1 of FIGS. 1 and 2 tests electrical characteristics of a wafer W which is a substrate, and specifically, tests the electrical characteristics of each of a plurality of semiconductor devices (refer to a reference numeral D in FIG. 3 described below) formed on the wafer W. The prober 1 includes an accommodation chamber 2 for accommodating the wafer W at the time of testing, a loader 3 arranged adjacent to the accommodation chamber 2, and a tester 4 arranged so as to cover an upper portion of the accommodation chamber 2.

The accommodation chamber 2 is a hollow housing and has a stage 10 which is a placement table on which the wafer W is placed. The stage 10 attracts and holds the wafer W so that a position of the wafer W with respect to the stage 10 does not shift. Detailed configuration of the stage 10 will be described below. Further, the stage 10 includes a movement mechanism 11. The movement mechanism 11 relatively moves a probe 12a of a probe card 12 described below and the stage 10, and in the present example, moves the stage 10 with respect to the probe 12a. More specifically, the movement mechanism 11 moves the stage 10 in a horizontal direction and a vertical direction. The movement mechanism 11 has a base table 11a made of a metal material such as stainless steel on which the stage 10 is arranged, and further, for example, although not shown, includes a guide rail, a ball screw, a motor, or the like for moving the base table 11a. By this movement mechanism 11, the position of the stage 10 with respect to the probe 12a of the probe card 12 described below can be adjusted so that an electrode on a surface of the wafer W placed on the stage 10 can be brought into contact with the probe 12a.

The probe card 12 having a large number of probes 12a which are contact terminals is arranged above the stage 10 in the accommodation chamber 2 so as to face the stage 10. The probe card 12 is connected to the tester 4 via an interface 13. Each probe 12a comes into contact with an electrode of each semiconductor device of the wafer W during testing of the electrical characteristics to supplies electric power from the tester 4 to the semiconductor device via the interface 13, and transmits a signal from the semiconductor device to the tester 4 via the interface 13.

The loader 3 takes out the wafer W accommodated in a front opening unified pod (FOUP) (not shown), which is a transport container, and transports the wafer W to the stage 10 of the accommodation chamber 2. Further, the loader 3 receives the wafer W for which the testing of the electrical characteristics of the semiconductor device has been completed from the stage 10 and accommodates the wafer W in the FOUP.

Further, the loader 3 has a controller 14 that controls an operation of each component in the accommodation chamber 2. The controller 14 is also referred to as a base unit or the like, consists of, for example, a computer having a central processing unit (CPU), a memory, or the like, and has a program storage (not shown). The program storage stores programs that control various processes in the prober 1. The program may be recorded on a computer-readable storage medium and may be installed on the controller 14 from the storage medium. Some or all of the programs may be realized by dedicated hardware (circuit board).

The tester 4 has a test board (not shown) that realizes a portion of a circuit configuration of a motherboard on which the semiconductor device is mounted. The test board is connected to a tester computer 18 that determines a quality of the semiconductor device based on a signal from the semiconductor device. In the tester 4, circuit configurations of a plurality of types of motherboards can be realized by replacing the test board.

Further, the prober 1 includes a user interface 19 for displaying information for a user and inputting an instruction by the user. The user interface 19 includes, for example, an input device, such as a touch panel or a keyboard, and a display such as a liquid crystal display.

In the prober 1 having each of the above-described components, the tester computer 18 transmits data to a test board connected to the semiconductor device via each probe 12a during testing of the electrical characteristics of the semiconductor device. Then, the tester computer 18 determines whether the transmitted data has been correctly processed by the test board based on the electrical signal from the test board.

Figure 3:
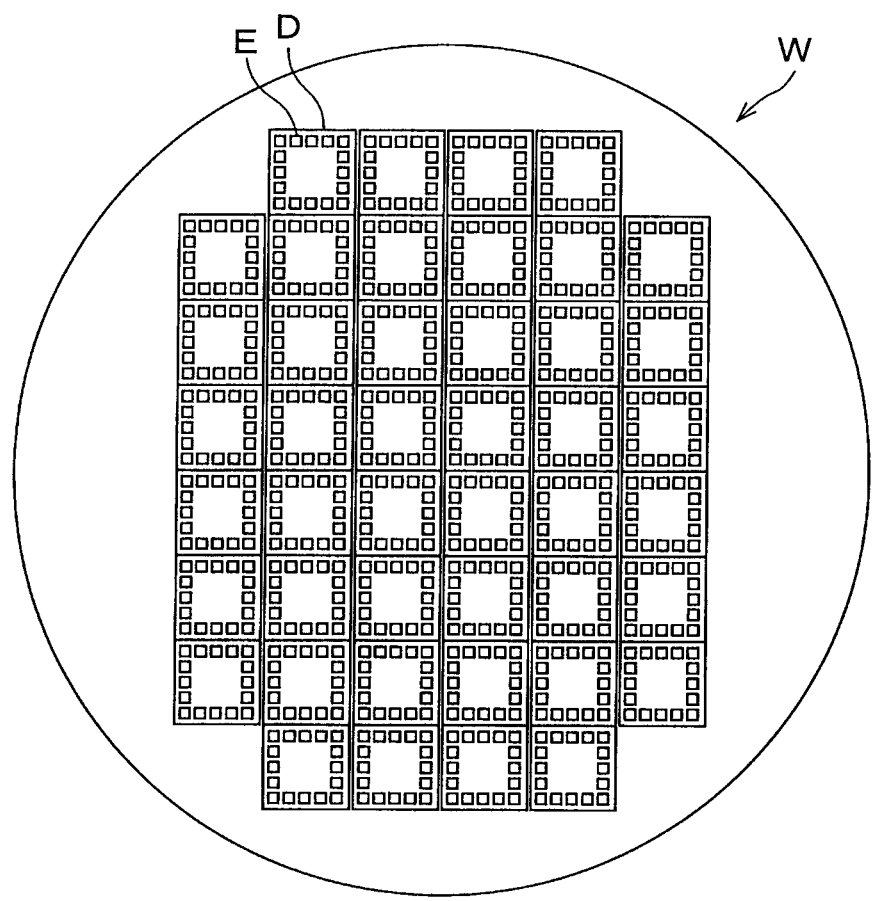
FIG. 3 is a schematic plan view illustrating a configuration of a wafer.

Next, the wafer W on which the semiconductor devices to be tested by the prober 1 are formed will be described with reference to FIG. 3. FIG. 3 is a schematic plan view illustrating a configuration of the wafer W.

For example, as shown in FIG. 3, a plurality of semiconductor devices D are formed on the surface of the wafer W at predetermined intervals by performing an etching process or an interconnection process on a substantially disk-shaped silicon substrate. Electrodes E are formed on the surface of the semiconductor device D, that is, the surface of the wafer W, and the electrodes E are electrically connected to circuit elements inside the semiconductor device D. By applying a voltage to the electrodes E, a current can be passed through the circuit elements inside each semiconductor device D. A size of each semiconductor device D is, for example, 10 to 30 mm2 in a plan view.

Figure 4:
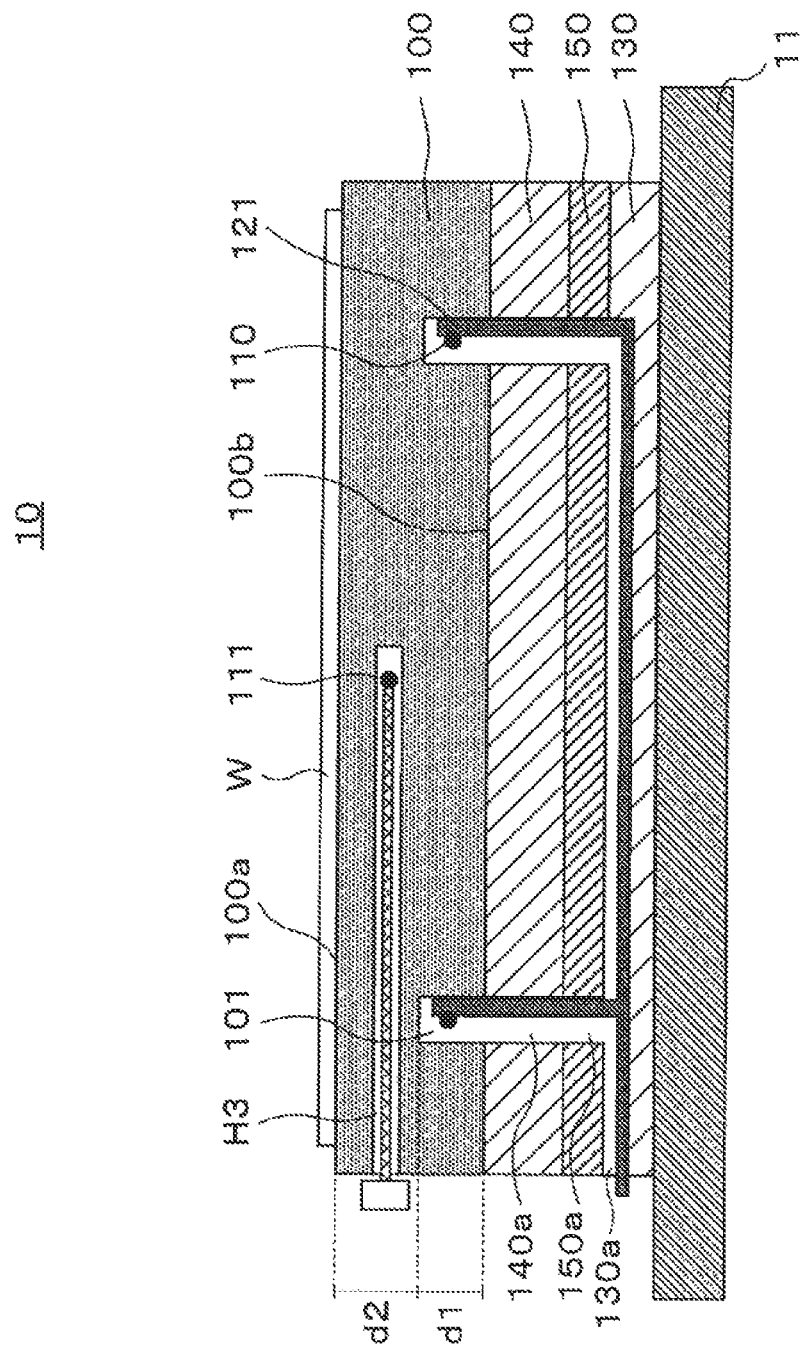
FIG. 4 is a schematic cross-sectional view illustrating a configuration of a stage which is a placement table according to the present embodiment.

Next, details of a configuration of the stage 10 described above will be described with reference to FIG. 4. FIG. 4 is a schematic cross-sectional view illustrating the configuration of the stage 10.

As shown in FIG. 4, the stage 10 which is the placement table is formed by stacking a plurality of functional portions including a top plate 100. The stage 10 is placed on the movement mechanism 11 (see FIG. 2), which moves the stage 10 in the horizontal direction and the vertical direction, via a heat insulating member 130.

The stage 10 has the top plate 100, a cooling unit 140, and a heating unit 150 in the order from the top. Further, the stage 10 is supported by the movement mechanism 11 from below the heating unit 150, in other words, from a rear surface of the heating unit 150, via the heat insulating member 130. Further, the stage 10 has a plurality of temperature sensors 110 and a positioning unit 120, as will be described below.

The top plate 100 is a member on which the semiconductor devices D (specifically, the wafer W on which the semiconductor devices D are formed) are placed. In other words, the top plate 100 is a member of which a surface (upper surface) is a placement surface on which the semiconductor device (specifically, the wafer W on which the semiconductor devices D are formed) is placed. In the following, the surface of the top plate 100, which is also the upper surface of the stage 10, may be referred to as a placement surface 100a. An adsorbing hole H1 (see FIG. 6) for adsorbing the wafer W is formed in the placement surface 100a of the top plate 100.

The top plate 100 is formed in a disk shape, for example. Further, for example, the top plate 100 is formed of a material having high thermal conductivity, such as Cu, Al, SiC, AlN, or carbon fiber. By forming the top plate 100 using the above-described material, the top plate 100 can be efficiently heated or cooled, and thus, the wafer W placed on the top plate 100 can be efficiently heated or cooled.

Figure 5:
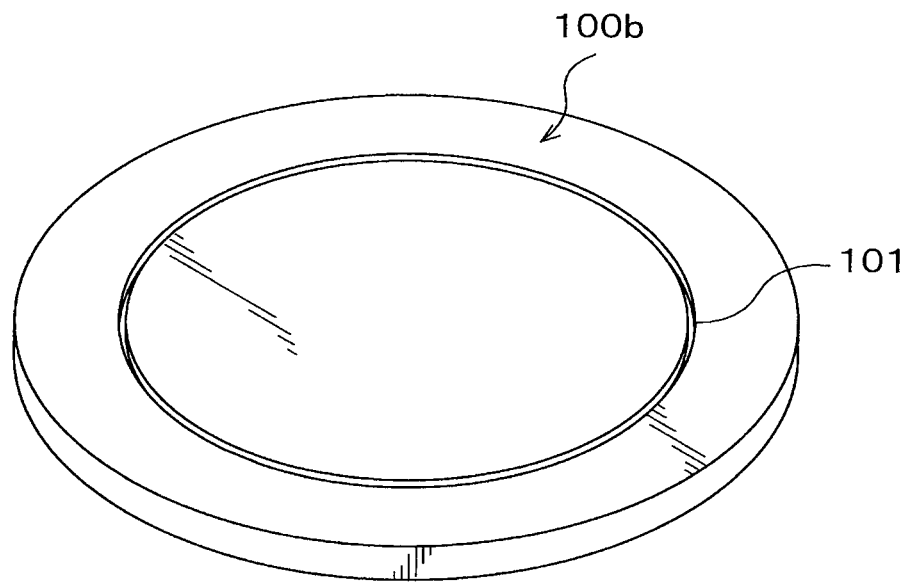
FIG. 5 is a schematic explanatory view illustrating the configuration of a recessed portion formed in a top plate.

As shown in FIGS. 4 and 5, a recessed portion 101 for arranging the temperature sensor 110 described below and the positioning unit 120 described below therein is formed in a rear surface 100b of the top plate 100. For example, the recessed portion 101 is formed in a substantially circular shape radially outside an insertion hole H2 (see FIG. 6) so as not to interfere with the insertion hole H2 into which a raising/lowering pin (not shown) for holding the wafer W on the placement surface 100a is inserted.

Further, as shown in FIG. 4, the recessed portion 101 is formed so as to face holes 140a, 150a and 130a formed in the cooling unit 140, the heating unit 150, and the heat insulating member 130.

The holes 140a and 150a are formed so as to pass through the cooling unit 140 and the heating unit 150 in a thickness direction. Further, the hole 130a is formed so that one end thereof faces the outside of the stage 10 (heat insulating member 130).

In the stage 10 according to the present embodiment, the positioning unit 120 described below is arranged inside the recessed portion 101 and the holes 140a, 150a and 130a, and the temperature sensors 110 described below are arranged inside the recessed portion 101.

Preferably, the recessed portion 101 is formed in the entire surface of the rear surface 100b so that the temperature of the entire surface of the top plate 100 in a plan view can be measured, in other words, the plurality of temperature sensors 110 can be dispersedly arranged on the entire surface of the top plate 100 in a plan view.

Further, preferably, the recessed portion 101 is formed uniformly (for example, in central axis symmetry or line symmetry) in the plane of the rear surface 100b as shown in FIG. 5, from the viewpoint of in-plane uniformity of heat transfer in the top plate 100 or structural strength (hereinafter, simply referred to as "yield strength").

Furthermore, preferably, a formation depth d1 (see FIG. 4) of the recessed portion 101 with respect to the top plate 100 is at least smaller than a thickness d2 (see FIG. 4) of a portion where the recessed portion 101 is not formed in order to suppress a decrease in yield strength of the top plate 100.

However, when the formation depth d1 is small, temperature responsiveness at the time of measuring the temperature of the wafer W is lowered. Accordingly, the formation depth d1 is set so that a balance between the temperature responsiveness and the yield strength of the top plate 100 is good.

As described above, the temperature sensors 110 are provided inside, for example, the recessed portion 101, and acquire the temperature of the top plate 100 during testing of the electrical characteristics of the semiconductor device D. As the temperature sensors 110, sensor members that can be arranged in a narrow space such as the recessed portion 101, for example, transistors, can be used. The transistors as the temperature sensors 110 utilize the principle that a voltage value measured when a current is supplied from a power supply (not shown) changes depending on the temperature of the top plate 100 to acquire the temperature of the top plate 100 based on the measured voltage value.

A size of the transistor as the temperature sensor 110 is, for example, about 3 mm2 in a plan view and about 1 mm in thickness.

Figure 6:
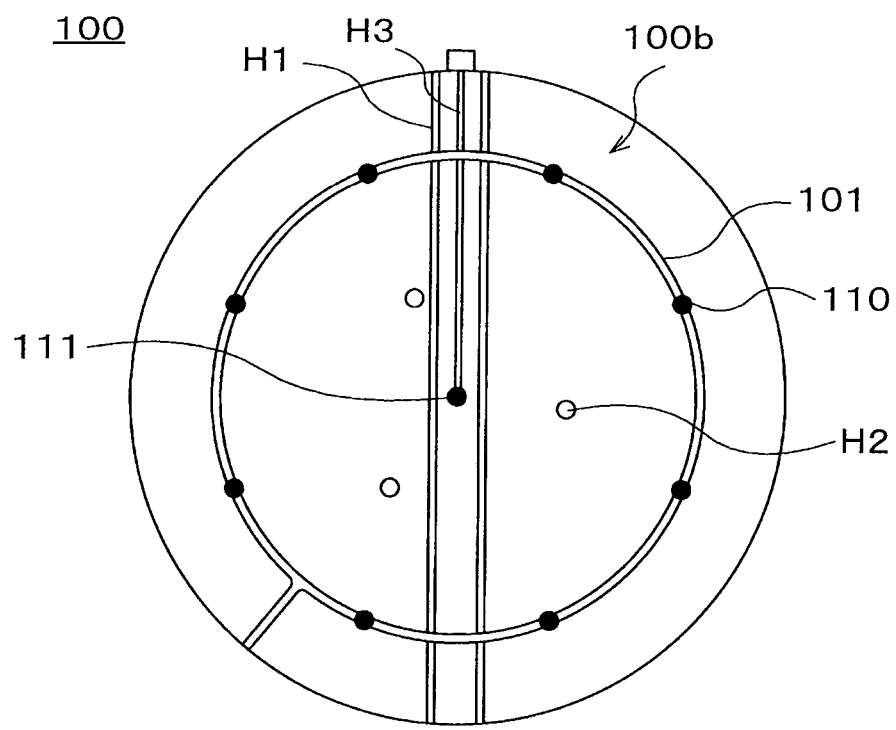
FIG. 6 is a plan view illustrating an arrangement example of temperature sensors.

Further, as shown in FIG. 6, a plurality of temperature sensors 110 (for example, eight in the illustrated example) are provided so as to be separated from each other in a plan view. In the following description, in the plan view of the top plate 100, the temperature sensors 110 are arranged in this way, and a position where the temperature is measured may be referred to as a "temperature measurement position."

In the present embodiment, as shown in FIG. 6, the temperature measurement positions where the temperature sensors 110 are arranged are determined in a circumferential direction of the top plate 100.

Although the number and arrangement of the temperature measurement positions can be arbitrarily determined, preferably, the number and arrangement of the temperature measurement positions are determined so that the temperature of the entire surface of the top plate 100 can be measured by the arranged temperature sensors 110, and an area in which each temperature sensor 110 is in charge of measuring the temperature is the same. In other words, preferably, the plurality of temperature sensors 110 are evenly distributed in the plane with respect to the top plate 100 in a plan view.

A second temperature sensor 111 may be further provided at a center portion of the top plate 100 in a plan view as shown in FIGS. 4 and 6. As the second temperature sensor 111, for example, a platinum resistance sensor conventionally used in the stage 10 of the prober 1 can be used. In such a case, the platinum resistance sensor as the second temperature sensor 111 is not arranged inside the recessed portion 101 but is arranged by inserting it into an insertion hole H3 formed from a side surface to the central portion of the top plate 100. In other words, the technology according to the present disclosure can be applied to the existing stage 10 by forming the recessed portion 101 in the existing stage 10 (top plate 100) and disposing the temperature sensor 110 therein.

As will be described below, in the testing of the electrical characteristics of the semiconductor device D, a measurement result of one temperature sensor corresponding to the semiconductor device D to be tested among the plurality of temperature sensors 110 or the second temperature sensor 111 provided in the stage 10 is used. As the temperature sensor corresponding to the semiconductor device D to be tested, for example, a temperature sensor closest to a center of the semiconductor device D to be tested in the plane direction is selected.

Figure 7:
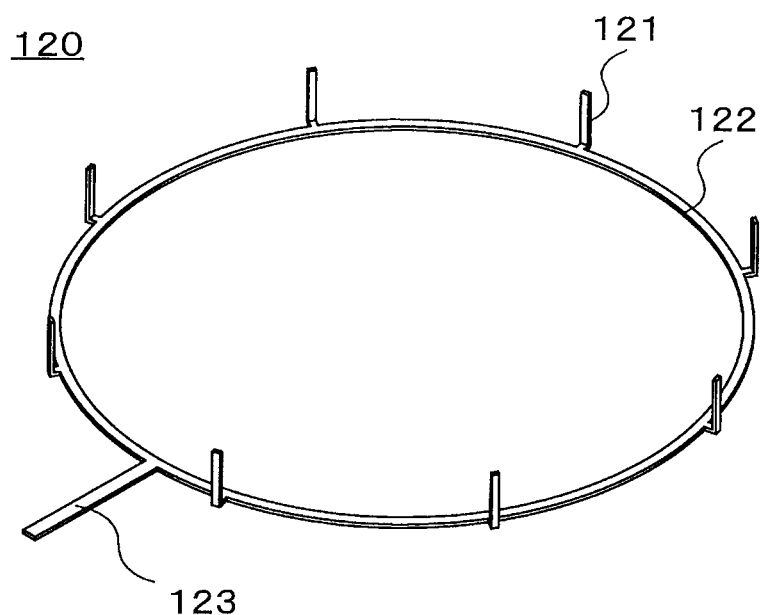
FIG. 7 is a schematic perspective view illustrating a configuration of a positioning unit.

The positioning unit 120 is electrically connected to the plurality of temperature sensors 110 and is a member for positioning the plurality of temperature sensors 110 at the temperature measurement positions. As shown in FIG. 7, the positioning unit 120 includes sensor connection members 121, a relay member 122, and a connector member 123.

The sensor connection members 121 are electrically connected to at least one or more temperature sensors 110 and serve as wiring boards that connect the temperature sensors 110 to a power supply (not shown) via the relay member 122 and the connector member 123 described below.

The sensor connection members 121 are arranged inside the recessed portion 101 formed in the top plate 100 while being connected to the temperature sensors 110 through the holes 140a and 150a, and thus, the temperature sensors 110 are positioned at the temperature measurement positions in the top plate 100. In other words, the sensor connection members 121 are formed as a convex portion of the positioning unit 120 according to the technology of the present disclosure, which protrudes upward (toward the placement surface 100a of the top plate 100) from the relay member 122 described below at the temperature measurement positions.

The sensor connection members 121 are flexible and are made of a material that can be electrically insulated from the wall surface (top plate 100) of the recessed portion 101, for example, a flexible printed circuit (FPC) in the present embodiment. The FPC is, for example, a flexible substrate having an insulating base portion and a conductive metal portion formed on the insulating base portion. By forming the sensor connection members 121 by FPC in this way, the sensor connection members 121 can be easily molded along a shape of the recessed portion 101 and can be appropriately operated as the wiring boards. Further, as described above, since the FPC can be formed to have a small thickness, a width of the recessed portion 101 formed in the top plate 100 can be reduced.

The material for forming the sensor connection members 121 is not limited to the present embodiment, and a rigid board can be used as long as it can be molded along the shape of the recessed portion 101 and can be operated as a wiring board.

Further, as in the present embodiment, the sensor connection members 121 may be formed of a material that can be electrically insulated from the wall surface (top plate 100) of the recessed portion 101, and for example, the wall surface of the recessed portion 101 may be coated with an insulating material.

As shown in FIG. 7, the relay member 122 is an annular member formed along the shape of the recessed portion 101 (more specifically, the hole 130a) and acts as a wiring board that electrically connects between the sensor connection members 121 and the connector member 123 described below.

The relay member 122 is flexible and is made of a material that can be electrically insulated from the top plate 100, for example, the FPC, in the present embodiment. By forming the relay member 122 by the FPC in this way, the relay member 122 can be easily molded along the shape of the recessed portion 101, and can be appropriately operated as a wiring board.

The material for forming the relay member 122 is not limited to the present embodiment, and a rigid board can be used as long as it can be molded along the shape of the recessed portion 101 and can be operated as a wiring board.

Further, as in the present embodiment, the relay member 122 may be formed of a material that can be electrically insulated from the top plate 100, and for example, an inside of the hole 130a with which the relay member 122 may come into contact may be coated with an insulating material.

The connector member 123 is a member for electrically connecting the temperature sensor 110 to the outside of the stage 10 via the sensor connection members 121 and the relay member 122.

Figure 8:
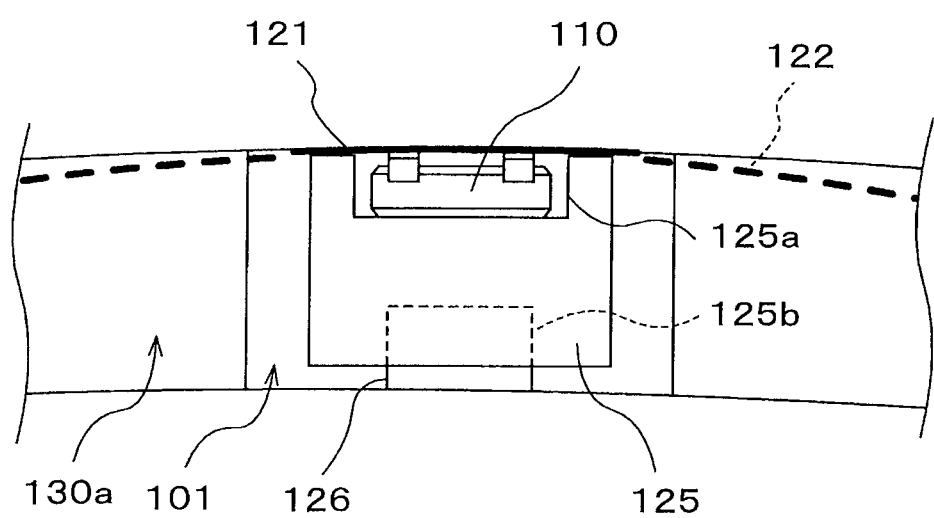
FIG. 8 is a schematic plan view illustrating a fixed structure of the temperature sensor.

Further, as shown in FIG. 8, the temperature sensor 110 is fixed to the wall surface of the recessed portion 101 by a pressing member 125 at the temperature measurement position in order to appropriately measure the temperature of the top plate 100. Specifically, as shown in FIG. 8, the temperature sensor 110 connected to the sensor connection member 121 is arranged so as to fit into a groove portion 125a formed in one side surface of the pressing member 125, and the sensor connection member 121 is brought into contact with the wall surface of the recessed portion 101. Then, in this state, an elastic member 126 (for example, a spring or the like) is arranged in a groove portion 125b formed in the other side surface of the pressing member 125. As a result, the pressing member 125 is pressed against the wall surface of the recessed portion 101 by elastic force of the elastic member 126, and thus, the temperature sensor 110 fitted in the groove portion 125a is fixed.

In the testing of the electrical characteristics of the semiconductor device D, the temperature of the semiconductor device D on the top plate 100 and the placement surface 100a is adjusted by the cooling unit 140 or the heating unit 150 described below. In this case, since the top plate 100 and the sensor connection member 121 have different coefficients of thermal expansion, there is a difference in amount of thermal deformation when the temperature of the top plate 100 is adjusted. Therefore, in order to suppress damage to the sensor connection member 121 due to the difference in amount of thermal deformation, it is preferable that the sensor connection member 121 is fixed so as to be able to absorb the thermal deformation.

Returning to the description of FIG. 4, the cooling unit 140 is a member that cools the top plate 100 and the wafer W (more specifically, the semiconductor device D formed on the wafer W) placed on the top plate 100.

The cooling unit 140 is provided closer to the placement surface 100a than the heating unit 150, and specifically, is joined to the rear surface of the top plate 100 so as to be interposed between the top plate 100 and the heating unit 150. The cooling unit 140 is formed, for example, in the shape of a disk having substantially the same diameter as the top plate 100.

The configuration of the cooling unit 140 is not particularly limited, and any configuration can be adopted as long as the top plate 100 and the semiconductor device D can be cooled. As an example, the cooling unit 140 may include a refrigerant flow path (not shown) through which a refrigerant flows.

The heating unit 150 is a member that heats the top plate 100 and the wafer W (more specifically, the semiconductor device D formed on the wafer W) placed on the top plate 100.

The heating unit 150 is arranged so as to face the wafer W placed on the placement surface 100a of the top plate 100 via the cooling unit 140. The heating unit 150 is formed, for example, in the shape of a disk having substantially the same diameter as the top plate 100.

The heating unit 150 may be configured such that the top plate 100 is divided into a plurality of heating regions (not shown) in a plan view, and the top plate 100 and the semiconductor device D can be independently heated for each heating region.

The configuration of the heating unit 150 is not particularly limited, and any configuration can be adopted as long as the top plate 100 and the semiconductor device D can be heated. As an example, the heating unit 150 may have a light-emitting diode (LED) unit (not shown) that heats the placement surface 100a by irradiating the placement surface 100a with light. Further, for example, the heating unit 150 may have a heater (not shown) as a heating element.

When the LED unit that irradiates the placement surface 100a with light is used as the heating unit 150, preferably, a material having light transmittance is used for the cooling unit 140 arranged between the heating unit 150 and the placement surface 100a and the refrigerant flowing inside the cooling unit 140.

The stage 10 according to the present embodiment is configured as described above.

According to the stage 10 according to the present embodiment, the plurality of temperature sensors are provided inside the top plate 100, in the illustrated example, in the circumferential direction of the top plate 100, and the second temperature sensor 111 is provided at the center portion of the top plate 100.

Accordingly, in the testing of the electrical characteristics of the semiconductor device D, a separation distance between the semiconductor device D to be tested and the corresponding temperature sensor 110 can be reduced by selecting the temperature sensor closest to the center of the semiconductor device D to be tested. As a result, in the testing of the electrical characteristics of the semiconductor device D, a temperature drop due to the separation between the semiconductor device D and the temperature sensor 110 is suppressed, that is, a difference between an actual temperature of the semiconductor device D and a temperature measured by the temperature sensor can be reduced appropriately.

Further, according to the present embodiment, sizes of the temperature sensor 110 and the sensor connection member 121 can be reduced using the transistor and the FPC as the temperature sensor 110 and the sensor connection member 121 respectively.

Accordingly, the formation width and the formation depth of the recessed portion 101 formed in the top plate 100 can be reduced, and thus, it is possible to prevent the yield strength of the top plate 100 (stage 10) from being reduced by the formation of the recessed portion 101.

Further, according to the present embodiment, the recessed portion 101 in which the temperature sensors 110 are provided is formed in the top plate 100, but the recessed portion 101 is formed so that the formation depth d1 of the recessed portion 101 is smaller than the thickness d2 of the portion where the recessed portion 101 is not formed.

In this way, a formed volume of the recessed portion 101, in other words, a cut volume of the top plate 100 can be made smaller than a structural volume of the top plate 100, and thus, the decrease in yield strength of the top plate 100 and the deformation of the top plate 100 during the testing are suppressed.

Further, as described above, the recessed portion 101 is formed in the rear surface 100b, which is the surface opposite to the placement surface 100a against which the probe 12a is pressed in the testing of the electrical characteristics of the semiconductor device D. That is, since the probe 12a is pressed against the placement surface 100a, which is the surface opposite to the surface where the recessed portion 101 which may reduce yield strength is formed, the pressing force is absorbed by the portion where the recessed portion 101 is not formed and deformation is more appropriately suppressed during the testing.

Further, according to the present embodiment, transistors are used as the temperature sensors 110, and the transistors are arranged inside the recessed portion 101 in a state of being connected to the sensor connection members 121 formed of, for example, the FPC.

As described above, the transistors disposed inside the recessed portion 101 are very small, for example, 3 mm2, in a plan view, and thus, the number of temperature measurement positions in a plan view can be easily increased. That is, the temperature of the top plate 100 can be measured more appropriately in the plane.

Further, since each of the transistor and the FPC arranged inside the recessed portion 101 has a small thickness, the formation width of the recessed portion 101 can be reduced. In other words, since the formed volume of the recessed portion 101 (cut volume of the top plate 100) can be reduced, the decrease in yield strength of the top plate 100 and the deformation during the testing of the electrical characteristics of the semiconductor device D are more appropriately suppressed.

Here, as described above, when a conventional temperature sensor with a sheath is used as the temperature sensor 110, it is necessary to form as many insertion holes as the number of temperature sensors 110 to be installed in the top plate 100, and thus, the yield strength of the top plate 100 may decrease.

In this respect, since the present embodiment uses the transistor as the temperature sensor 110 as described above, the plurality of temperature sensors 110 can be mounted on one sensor connection member 121. Accordingly, the number of recessed portions 101 (corresponding to insertion holes) formed in the top plate 100 can be reduced, that is, the yield strength of the top plate 100 is prevented from being impaired, and the deformation of the top plate 100 is suppressed more appropriately during the testing of the electrical characteristics of the semiconductor device D.

Further, in the stage 10 according to the present embodiment, for example, by forming the recessed portion 101 in the top plate provided in the existing stage shown in Japanese Patent Application Publication No. 2011-0002390 and arranging the temperature sensors 110 inside the recessed portion 101, the technology according to the present disclosure can be applied to the existing stage. Therefore, by using the existing stage 10 in this way, costs and labor required for introducing the stage 10 can be appropriately reduced as compared with a case where the stage 10 is newly produced and provided inside the prober 1.

In this case, the platinum resistance sensor used in the existing stage 10 and the insertion hole for inserting the platinum resistance sensor may be used without change.

In the embodiment (see FIG. 4), the holes 140a and 150a are formed so as to pass through the cooling unit 140 and the heating unit 150, and the positioning unit 120 (the sensor connection members 121) is disposed to be inserted through the holes 140a and 150a. However, as shown in FIG. 9, the recessed portion 101 may be formed in the rear surface of the top plate 100 along the shape of the relay member 122, and the positioning unit 120 including the sensor connection members 121 and the relay member 122 may be arranged inside the recessed portion 101.

Figure 9:
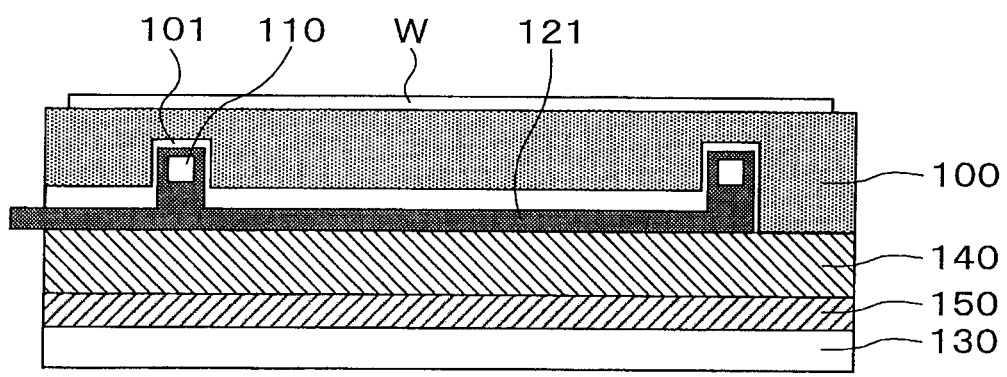
FIG. 9 is a schematic cross-sectional view illustrating another arrangement example of the positioning unit.

As in the embodiments shown in FIGS. 4 and 9, the temperature sensor 110 can be provided on the placement surface 100a side by providing the temperature sensor 110 on the sensor connection member 121 which is arranged so as to extend in the vertical direction, that is, the distance from the semiconductor device D to be tested can be reduced. Accordingly, responsiveness of the temperature measurement by the temperature sensor 110 can be improved when testing the electrical characteristics of the semiconductor device D. Moreover, the difference between the actual temperature of the semiconductor device D and the temperature measured by the temperature sensor 110 can be further appropriately reduced.

In this case, the recessed portion 101 is formed deeply only at a position corresponding to the temperature measurement position where the temperature sensor 110 is arranged. Accordingly, the formed volume of the recessed portion 101 (cut volume of the top plate 100) is not extremely increased, and thus, the yield strength of the top plate 100 is prevented from being significantly reduced.

In the embodiment, the example case where a total of nine temperature sensors are provided in the plane of the top plate 100 is described. However, in case where the number of the temperature sensors (the number of temperature measurement positions) increases, when the recessed portion 101 is formed deeply as described above at all such temperature measurement positions, the yield strength of the top plate 100 may decrease.

Therefore, in consideration of the yield strength of the top plate 100 and the responsiveness of the temperature measurement by the temperature sensor 110, in the plurality of temperature measurement positions, the temperature sensors 110 may be installed on the relay member 122 without providing the sensor connection members 121 as described above.

In the above embodiment, the example case where the recessed portion 101 is formed in the rear surface 100b of the top plate 100 and the temperature sensors 110 and the sensor connection members 121 are arranged inside the recessed portion 101 is described. However, a method of installing the temperature sensors 110 on the top plate 100 is not limited to this.

Specifically, for example, the temperature sensors 110 and the sensor connection members 121 may be directly connected to the rear surface 100b without forming the recessed portion 101 in the top plate 100.

In such a case, since it is not necessary to provide the recessed portion 101 in the top plate 100, decrease in the yield strength of the top plate 100 due to the formation of the recessed portion 101 does not occur. Moreover, since it is not necessary to form the recessed portion 101, the thickness of the top plate 100 can be reduced.

However, when the temperature sensors 110 are provided on the rear surface 100b in this way, a distance between the temperature sensors 110 and the cooling unit 140 and the heating unit 150 becomes short. In other words, when testing the electrical characteristics of the semiconductor device D, it may be affected by the cooling unit 140 and the heating unit 150, that is, the testing may not be performed appropriately. From this point of view, it is preferable that the temperature sensors 110 and the sensor connection members 121 are provided inside the recessed portion 101.

In the above embodiment, the example case where the transistors are used as the temperature sensors 110 is described, but the type of the temperature sensors 110 is not limited to this. For example, diodes may be used as the temperature sensors 110 as long as they can be arranged inside the recessed portion 101 and can be electrically connected via the sensor connection members 121. Further, for example, a resistance temperature detector (RTD) chip (including a platinum resistor) may be used as the temperature sensors.

Further, in the above embodiment, the example case where the platinum resistance sensor is used as the second temperature sensor 111 is described, but the type of the second temperature sensor 111 is not limited to this. For example, a transistor or a diode may be used as the second temperature sensor 111 by extending or newly installing the sensor connection members 121.

Although various exemplary embodiments have been described above, various additions, omissions, substitutions, and modifications may be made without being limited to the exemplary embodiments. Moreover, it is possible to combine elements in different embodiments to form other embodiments.

Next, an example of the testing method of the semiconductor device D performed in the prober 1 including the stage 10 configured as described above will be described.

(A1. Wafer Placement)

First, the wafer W is unloaded from the FOUP of the loader 3, is transported toward the stage 10, and is placed on the placement surface 100a of the top plate 100. Subsequently, the stage 10 is moved to a predetermined position.

(A2. Temperature Adjustment of Placement Surface)

Further, under the control of the controller 14, the semiconductor device D to be tested on the placement surface 100a of the top plate 100 is controlled to have a desired set temperature. Specifically, the placement surface 100a is cooled and heated by the cooling unit 140 and the heating unit 150 to adjust the placement surface 100a to a desired temperature. In this case, it is desirable that the temperature of the placement surface 100a is independently controlled for each of the plurality of heating regions described above.

The temperature of the placement surface 100a may be adjusted uniformly over the entire surface of the placement surface 100a or may be adjusted to a different temperature for each heating region according to processing conditions. Further, for example, the temperature of only the heating region to which the semiconductor device D to be tested belongs may be locally adjusted.

In addition, this operation A2 may be started before the completion of the operation A1.

(A3. Contact)

After the placement surface 100a is adjusted to the desired temperature, the movement mechanism 11 is driven under the control of the controller 14, and the stage 10 is moved relative to the probe 12a. Accordingly, the probe 12a and the semiconductor device D to be tested are aligned with each other and come into contact with each other. Specifically, the probe 12a and the electrodes E of the semiconductor device D to be tested are aligned with each other and come into contact with each other.

(A4. Electrical Characteristic Testing)

Thereafter, the electrical characteristics of the semiconductor device D to be tested are tested. Specifically, a signal for testing is input to the semiconductor device D via the probe 12a, and a signal from the semiconductor device D is output to the tester 4 via the probe 12a.

During this electrical characteristic testing, the placement surface 100a is cooled by the cooling unit 140 and the placement surface 100a is heated by the heating unit 150, and thus, the temperatures of the placement surface 100a and the semiconductor device D to be tested are adjusted so as to be constant at a desired target temperature.

Here, in the electrical characteristic testing, the semiconductor device D generates heat when a signal for testing of the semiconductor device D is input via the probe 12a. As described above, the amount of heat generated by the semiconductor device D is increasing with the recent increase in integration of semiconductor devices. Therefore, even when the temperature of the placement surface 100a is uniformly controlled by the cooling unit 140 and the heating unit 150, the temperature of the semiconductor device D may not be uniformly controlled due to the influence of heat generated by each semiconductor device D.

In such a state, when the number of temperature sensors provided inside the top plate 100 is only one as disclosed in Japanese Patent Application Publication No. 2011-0002390, there was a risk that the temperature of each semiconductor device D could not be appropriately acquired. Specifically, since the temperature of the semiconductor device D to be tested increases as the amount of the heat generated by the semiconductor device increases, even when a heat conduction value of the top plate 100 on which the semiconductor device D is placed is high (the thermal resistance value is small), a large temperature difference occurs. That is, there was a risk that a difference may occur between the actual temperature of the semiconductor device D and the temperature measured by the temperature sensor 110 due to the distance between the semiconductor device D to be tested and the temperature sensor 110 in the plane direction.

In this regard, according to the stage 10 according to the present embodiment, the plurality of temperature sensors 110 (transistors) and the second temperature sensor 111 (platinum resistance sensor) are arranged inside the top plate 100. Moreover, in the present embodiment, as described above, the temperature sensor closest to the center of the semiconductor device D to be tested is selected, and the temperature of the semiconductor device D is acquired by the selected temperature sensor. Accordingly, since the separation between the semiconductor device D to be tested and the temperature sensor can be at least smaller as compared with the conventional case, that is, the heat transfer effect in the top plate 100 can be reduced, the difference between the actual temperature of the semiconductor device D and the temperature measured by the temperature sensor can be reduced.

As the temperature used as the temperature of the semiconductor device D in the electrical characteristic testing, a temperature acquired by the temperature sensor closest to the center of the semiconductor device D to be tested as described above may be used without change, but the acquired temperature may be corrected and then used.

Specifically, the temperature acquired by the temperature sensor may be corrected using, for example, a heat conduction equation, based on the separation distance between the temperature sensor and the semiconductor device D to be tested. In this way, by correcting the temperature acquired by the temperature sensor and calculating a predicted value of the actual temperature of the semiconductor device D to be tested, the difference between the actual temperature of the semiconductor device D and the temperature acquired by the temperature sensor (calculated corrected temperature) can be reduced more appropriately.

Furthermore, as the temperature used as the temperature of the semiconductor device D in the electrical characteristic testing, the temperature acquired by one temperature sensor selected as described above can be complemented by a temperature acquired by another temperature sensor arranged around the temperature sensor.

Specifically, as described above, in the stage 10 according to the present embodiment, a plurality of temperature sensors are evenly distributed in the plane with respect to the top plate 100. That is, at least one or more another temperature sensors are evenly arranged around one temperature sensor selected as described above (see FIG. 6).

Therefore, by comparing the temperature acquired by one temperature sensor with the temperature acquired by another temperature sensors arranged around the one temperature sensor, for example, by acquiring an average value or a median value, the acquired temperature by one temperature sensor is complemented, and thus, reliability of the acquired temperature by one temperature sensor can be improved. In other words, the difference between the actual temperature of the semiconductor device D and the temperature acquired by the temperature sensor (calculated complementary temperature) can be reduced more appropriately.

In the above description, the example case where the temperature acquired by one temperature sensor is complemented by the temperature acquired by another temperature sensor arranged around the one temperature sensor is described. However, the same applies when there are a plurality of temperature sensors closest to the center of the semiconductor device D to be tested. That is, based on a plurality of temperatures acquired by the plurality of temperature sensors closest to the center of the semiconductor device D to be tested, for example, by acquiring the average value or the median value, the acquired temperature by the temperature sensor is complemented, and thus, the difference between the actual temperature of the semiconductor device D and the temperature acquired by the temperature sensor can be reduced.

When the electrical characteristic testing of the wafer W carried into the prober 1 is completed, the contact between the probe 12a and the semiconductor device D to be tested is released.

Subsequently, the above-described operations A2 to A4 are sequentially performed on the semiconductor device D to be tested next. After that, the above-described operations A2 to A4 are repeated until the electrical characteristic testing of all semiconductor devices D is completed.

When the electrical characteristic testing of all the semiconductor devices D is completed, the wafer W is removed from the stage 10 and carried out to the FOUP of the loader 3. Accordingly, a series of testing processes is completed.

Among the semiconductor devices D formed on the wafer W, the entire semiconductor devices D may not be tested, but only some semiconductor devices D may be tested.

As described above, according to the testing method of the semiconductor device D according to the present embodiment, the temperature sensor 110 closest to the center of the semiconductor device D to be tested is selected from the plurality of temperature sensors provided in the top plate 100, and the temperature of the semiconductor device D is acquired. Accordingly, the distance between the semiconductor device D to be tested and the temperature sensor can be reduced as compared with the conventional case, and thus, the difference between the actual temperature of the semiconductor device D and the temperature acquired by the temperature sensor can be reduced more appropriately.

Further, in this case, by correcting the temperature acquired by the selected temperature sensor based on the separation distance from the semiconductor device D to be tested, the difference between the actual temperature of the semiconductor device D and the temperature acquired by the temperature sensor (calculated corrected temperature) can be reduced more appropriately.

Further, in this case, by complementing the temperature acquired by the selected one temperature sensor with the temperature acquired by another temperature sensor arranged around the one temperature sensor, the difference between the actual temperature of the semiconductor device D and the temperature acquired by the temperature sensor (calculated complemented temperature) can be reduced more appropriately.

The embodiments disclosed here should be considered to be exemplary in all respects and not restrictive. The above embodiments may be omitted, replaced or modified in various forms without departing from the scope of the appended claims and their gist.

What is claimed is:

1. A placement table having an upper surface on which a device to be tested is placed, the placement table comprising:
   a top plate having a placement surface for the device;
   a heating unit configured to heat the top plate;
   a plurality of temperature sensors configured to acquire temperature of the top plate at desired measurement positions in a plan view; and
   a positioning unit electrically connected to the temperature sensors and configured to position the temperature sensors at the measurement positions in a plan view,
   wherein the positioning unit is formed of a flexible substrate having flexibility,
   wherein the placement table comprises a controller for heating the top plate to a desired temperature by the heating unit; acquiring a temperature of the top plate by the temperature sensors; and calculating a temperature of the device to be tested from the measured temperature of the top plate,
   wherein the controller is configured to select the temperature sensor, which is closest from a center of the device in a plan view, among the plurality of temperature sensors; and to calculate the temperature of the device based on the temperature of the top plate measured by the selected temperature sensor.

2. The placement table of claim 1, wherein a recessed portion is formed in a rear surface of the top plate, at least a part of the temperature sensors and the positioning unit is arranged inside the recessed portion.

3. The placement table of claim 2, wherein the positioning unit includes convex portions protruding toward the placement surface of the top plate in a state of being arranged inside the recessed portion at a position corresponding to the measurement position in a plan view, and
   the temperature sensors are connected to the convex portions of the positioning unit.

4. The placement table of claim 1, wherein the positioning unit includes:
   a plurality of sensor connection members to which the temperature sensors are connected;
   a connector member electrically connected to outside the placement table; and
   a relay member electrically connecting the plurality of sensor connection members and the connector member to each other.

5. The placement table of claim 4, wherein each of the plurality of temperature sensors is connected to each of the plurality of sensor connection members.

6. The placement table of claim 1, wherein the plurality of temperature sensors are arranged in a circumferential direction of the top plate in a plan view.

7. The placement table of claim 1, wherein the temperature sensors include at least one of a platinum resistance sensor and a transistor sensor.

8. The placement table of claim 7, wherein the platinum resistance sensor is disposed at a center portion of the top plate in a plan view, and
   the transistor sensors are arranged in a circumferential direction of the top plate in a plan view.

9. The placement table of claim 1, further comprising a cooling unit configured to cool the top plate,
   wherein the top plate, the cooling unit, and the heating unit are stacked and arranged in this order from above.

10. A testing device for testing a device to be tested, the testing device comprising:
    a probe that is pressed against the device with a predetermined load when the device is tested; and
    a placement table having an upper surface on which the device to be tested is placed, the placement table comprising:
       a top plate having a placement surface for the device;
       a heating unit configured to heat the top plate;
       a plurality of temperature sensors configured to acquire temperature of the top plate at desired measurement positions in a plan view; and
       a positioning unit electrically connected to the temperature sensors and configured to position the temperature sensors at the measurement positions in a plan view,
       wherein the positioning unit is formed of a flexible substrate having flexibility,
    wherein the placement table comprises a controller for heating the top plate to a desired temperature by the heating unit; acquiring a temperature of the top plate by the temperature sensors; and calculating a temperature of the device to be tested from the measured temperature of the top plate,
    wherein the controller is configured to select the temperature sensor, which is closest from a center of the device in a plan view, among the plurality of temperature sensors; and to calculate the temperature of the device based on the temperature of the top plate measured by the selected temperature sensor.

11. A testing method of bringing a plurality of devices to be tested into contact with a probe to test the plurality of devices using a testing device, the testing device comprising:
    a top plate having a placement surface for the device;
    a heating unit configured to heat the top plate;
    a plurality of temperature sensors configured to acquire temperature of the top plate at desired measurement positions in a plan view; and a positioning unit electrically connected to the temperature sensors and configured to position the temperature sensors at the measurement positions in a plan view, wherein the positioning unit is formed of a flexible substrate having flexibility, and the testing method comprising:

heating the top plate to a desired temperature by the heating unit;

acquiring a temperature of the top plate by the temperature sensors; and calculating a temperature of the device to be tested from the measured temperature of the top plate, wherein said calculating the temperature of the device to be tested from the measured temperature of the top plate comprises:

selecting the temperature sensor, which is closest from a center of the device in a plan view, among the plurality of temperature sensors; and calculating the temperature of the device based on the temperature of the top plate measured by the selected temperature sensor.

12. The testing method of claim 11, wherein, in said selecting, another temperature sensor is further selected, and in said calculating the temperature of the device based on the temperature of the top plate measured by the selected temperature sensor, the calculated temperature of the device is complemented based on a temperature measured by said another temperature sensor.

* * * * *